United States Patent
Matsumoto et al.

(10) Patent No.: US 12,041,794 B2
(45) Date of Patent: *Jul. 16, 2024

(54) SEMICONDUCTOR STORAGE DEVICE COMPRISING STAIRCASE PORTION

(71) Applicant: Kioxia Corporation, Tokyo (JP)

(72) Inventors: Sota Matsumoto, Yokkaichi (JP); Takahito Nishimura, Kuwana (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/569,567

(22) Filed: Jan. 6, 2022

(65) Prior Publication Data
US 2022/0130829 A1 Apr. 28, 2022

Related U.S. Application Data

(63) Continuation of application No. 16/809,622, filed on Mar. 5, 2020, now Pat. No. 11,264,387.

(30) Foreign Application Priority Data

Aug. 30, 2019 (JP) .................................. 2019-158388

(51) Int. Cl.
*H10B 99/00* (2023.01)
*H01L 21/308* (2006.01)
(Continued)

(52) U.S. Cl.
CPC ........... *H10B 99/00* (2023.02); *H01L 21/308* (2013.01); *H01L 21/8221* (2013.01);
(Continued)

(58) Field of Classification Search
CPC ........ H10B 99/00; H10B 41/20; H10B 41/35; H10B 41/40; H10B 43/27; H10B 43/50;
(Continued)

(56) References Cited

U.S. PATENT DOCUMENTS 8,822,285 B2  9/2014  Hwang et al.
9,773,804 B2  9/2017  Lee
(Continued)

FOREIGN PATENT DOCUMENTS

CN  106711146 A  5/2017
CN  107342289 A  11/2017

*Primary Examiner* — Duy T Nguyen
(74) *Attorney, Agent, or Firm* — Oblon, McClelland, Maier & Neustadt, L.L.P.

(57) ABSTRACT

A semiconductor storage device according to an embodiment includes: a stacked body in which a plurality of conductive layers are stacked via an insulating layer and which has a memory region in which a plurality of memory cells are disposed and a staircase region in which end portions of the plurality of conductive layers form a staircase shape. A first region of the staircase region includes a first sub-staircase portion ascending in a first direction toward the memory portion, and a second sub-staircase portion disposed side by side with the first sub-staircase portion in a second direction opposite to the first direction from the first sub-staircase portion and ascending in the second direction.

20 Claims, 14 Drawing Sheets

(51) Int. Cl.
*H01L 21/822* (2006.01)
*H01L 27/06* (2006.01)
*H10B 41/20* (2023.01)
*H10B 41/35* (2023.01)
*H10B 41/40* (2023.01)

(52) U.S. Cl.
CPC ......... *H01L 27/0688* (2013.01); *H10B 41/20* (2023.02); *H10B 41/35* (2023.02); *H10B 41/40* (2023.02)

(58) Field of Classification Search
CPC ........ H10B 43/40; H10B 41/30; H10B 41/27; H10B 43/30; H01L 21/308; H01L 21/8221; H01L 27/0688; H01L 21/31144
USPC ........................................................ 257/182
See application file for complete search history.

(56) References Cited

U.S. PATENT DOCUMENTS

| | | | |
|---|---|---|---|
| 9,985,041 B2 | 5/2018 | Yun et al. | |
| 10,141,372 B2 | 11/2018 | Park et al. | |
| 2013/0161821 A1* | 6/2013 | Hwang | H10B 43/27 257/E21.585 |
| 2014/0162420 A1* | 6/2014 | Oh | H10B 43/27 438/270 |
| 2015/0311153 A1* | 10/2015 | Oh | H10B 43/40 257/618 |
| 2017/0047334 A1* | 2/2017 | Lu | H10B 43/10 |
| 2017/0077027 A1* | 3/2017 | Shimizu | H10B 43/35 |
| 2017/0141032 A1* | 5/2017 | Lee | H10B 43/27 |
| 2017/0236746 A1 | 8/2017 | Yu et al. | |
| 2017/0236830 A1* | 8/2017 | Inatsuka | H10B 41/27 257/620 |
| 2020/0251490 A1 | 8/2020 | Matsumoto | |

* cited by examiner

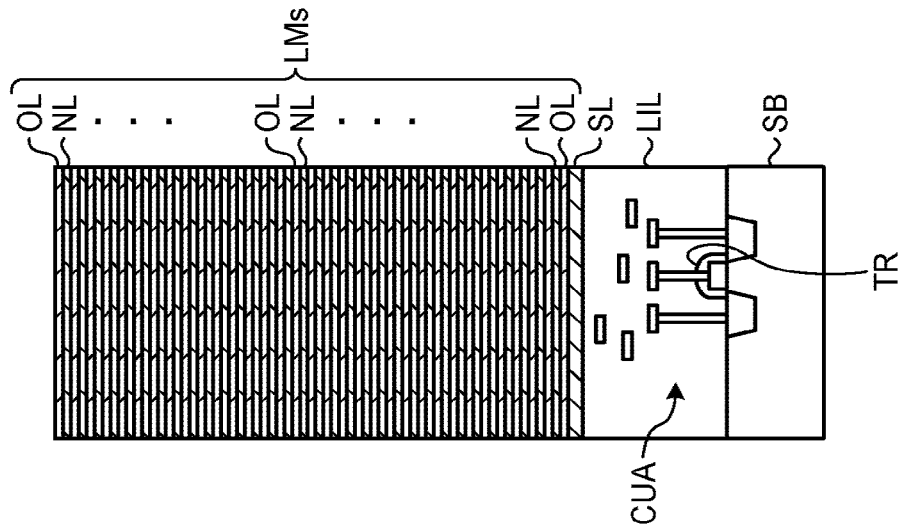
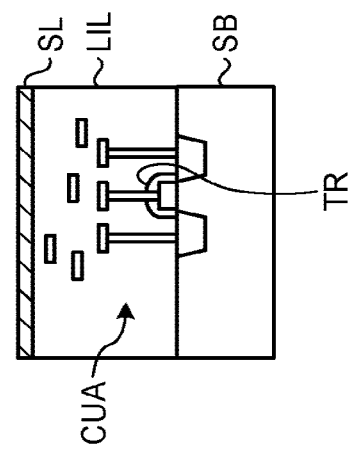
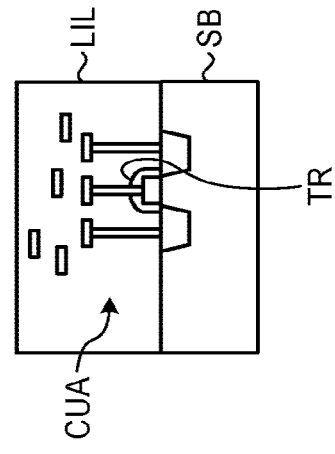

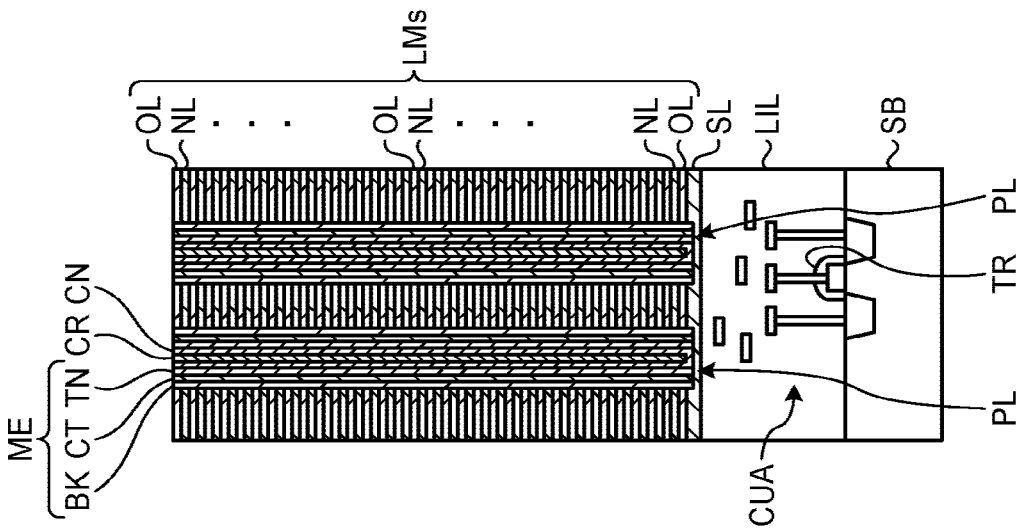
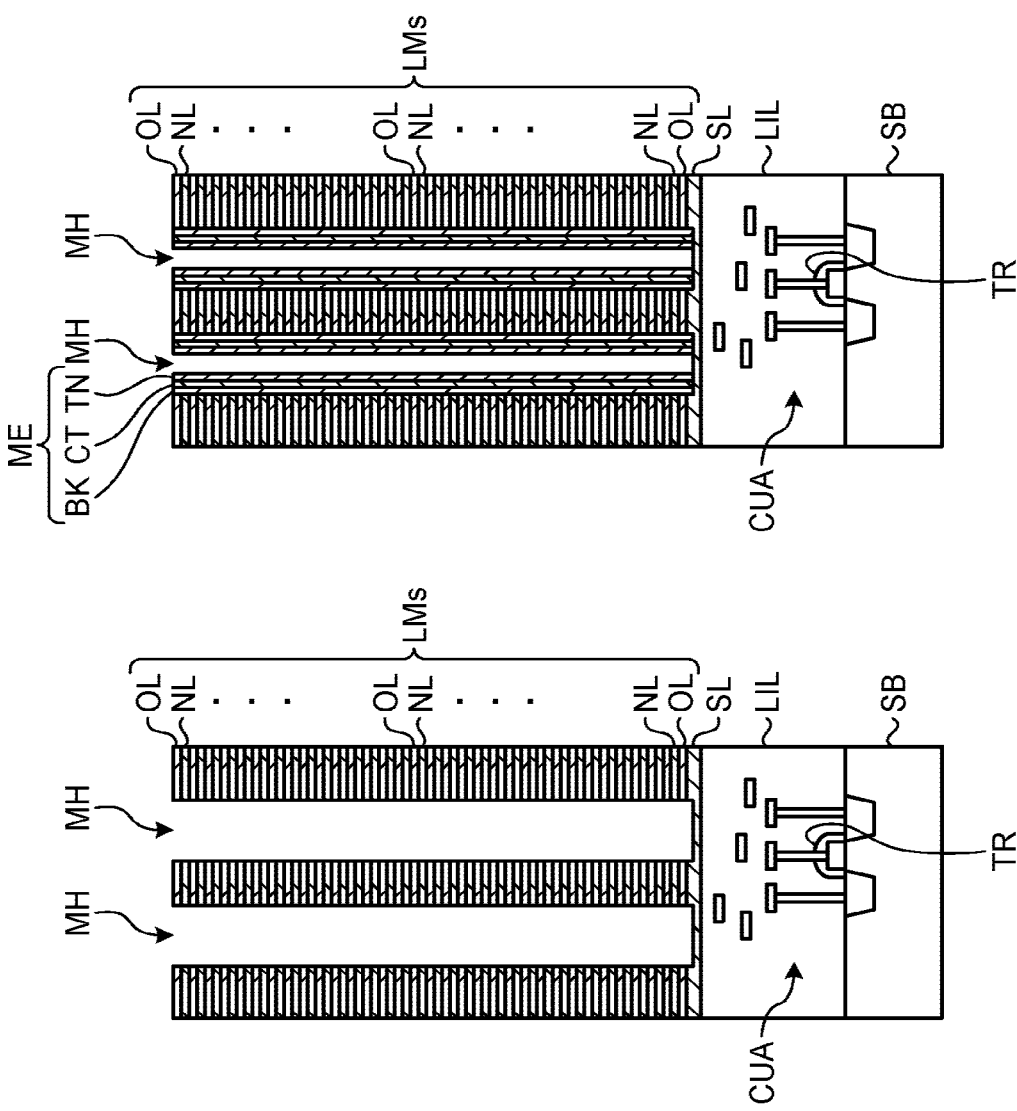

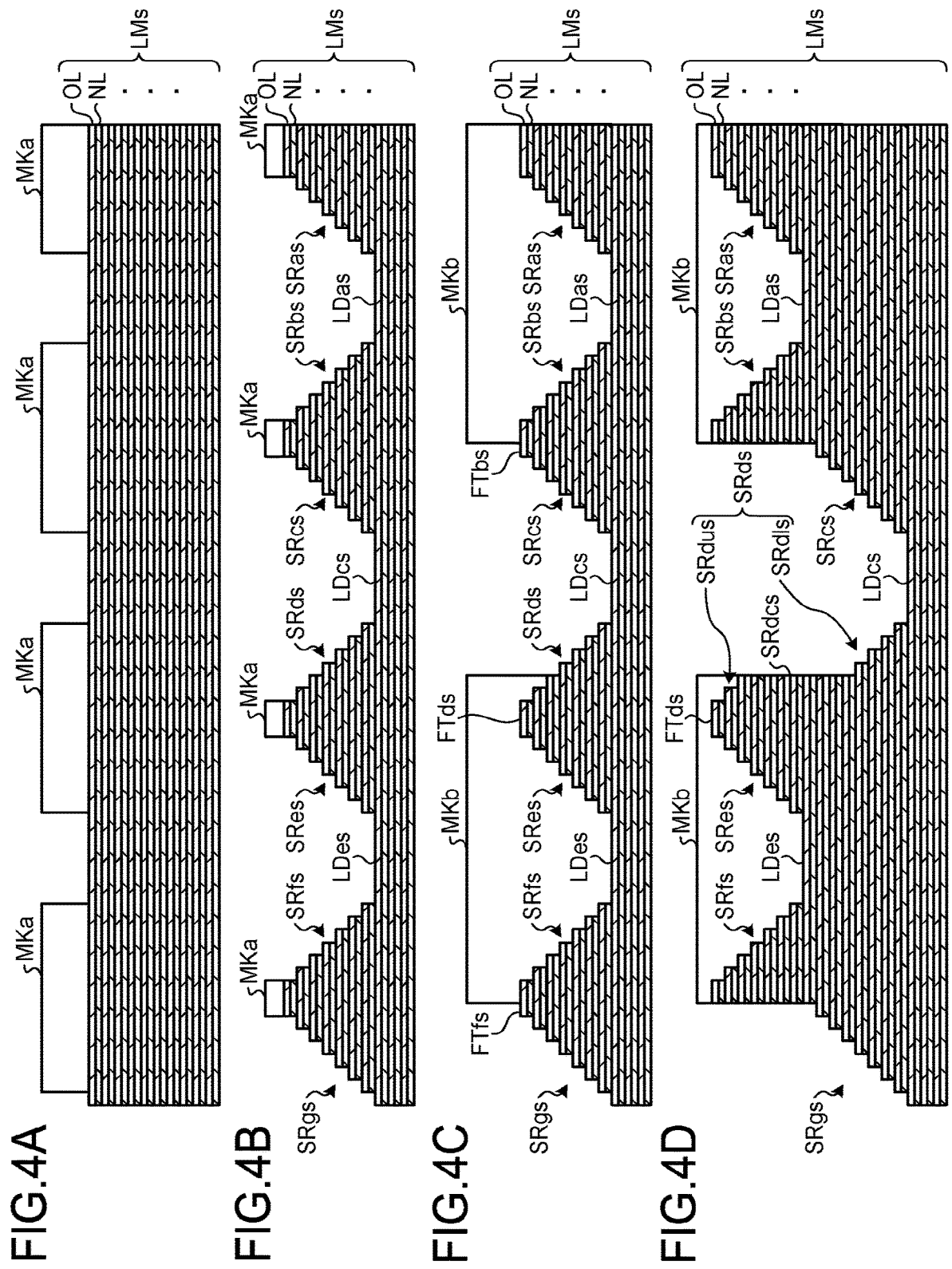

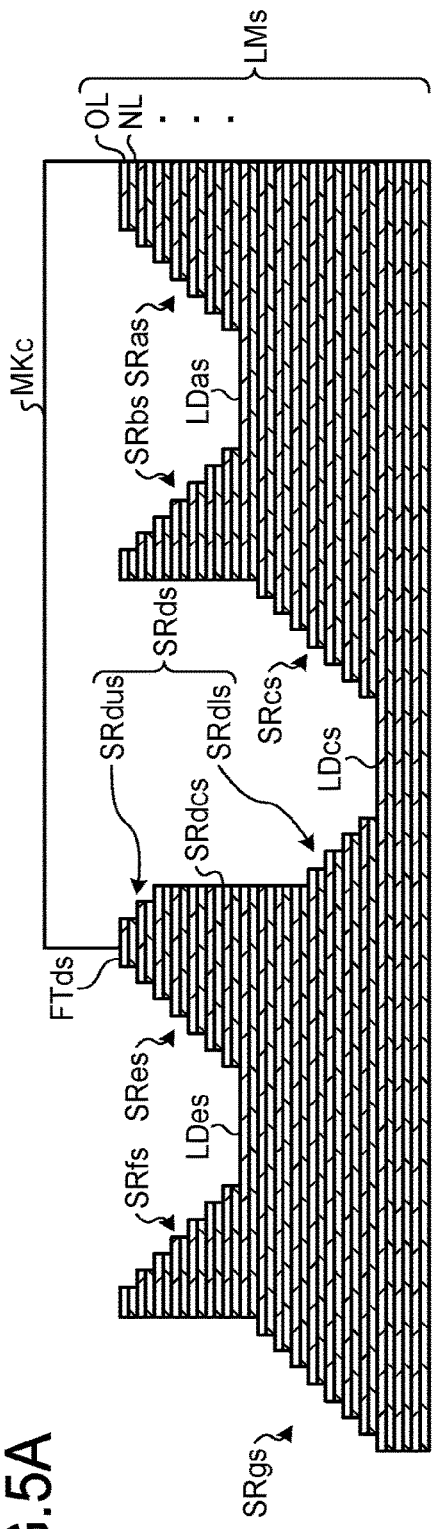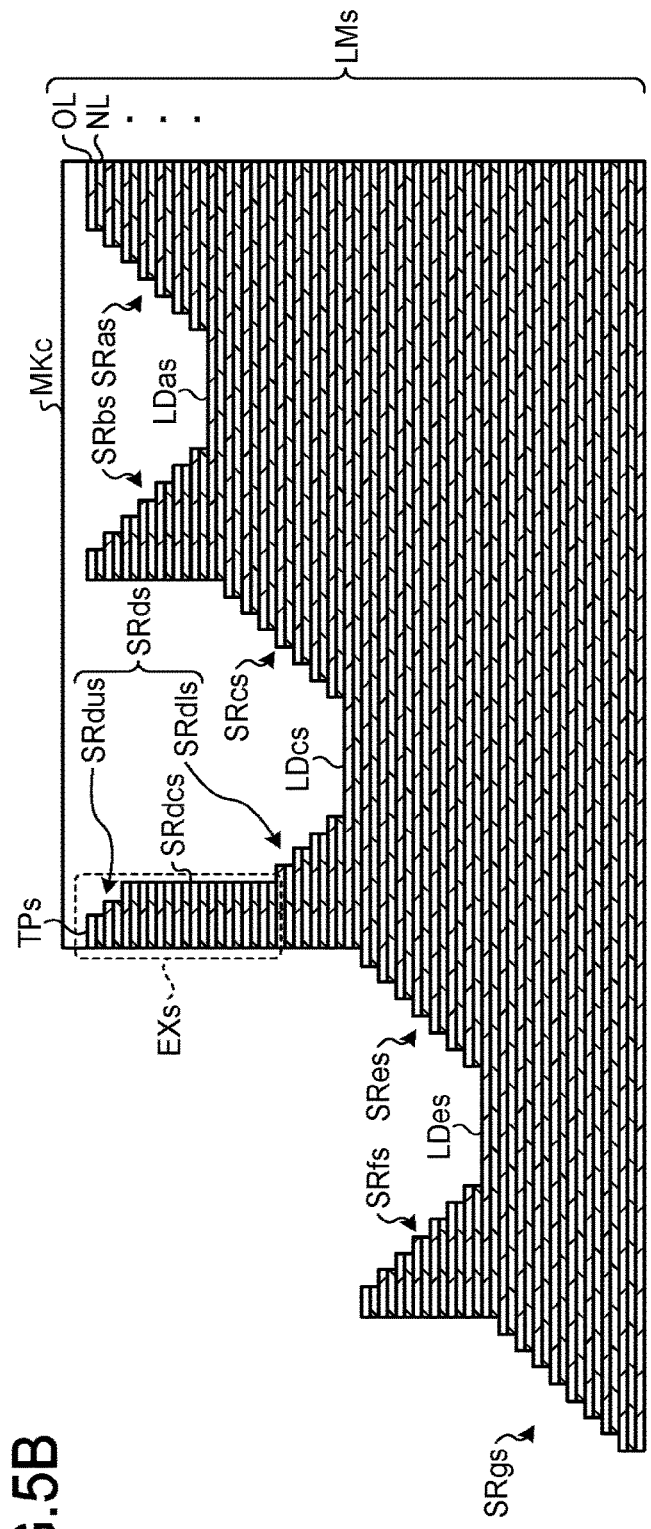

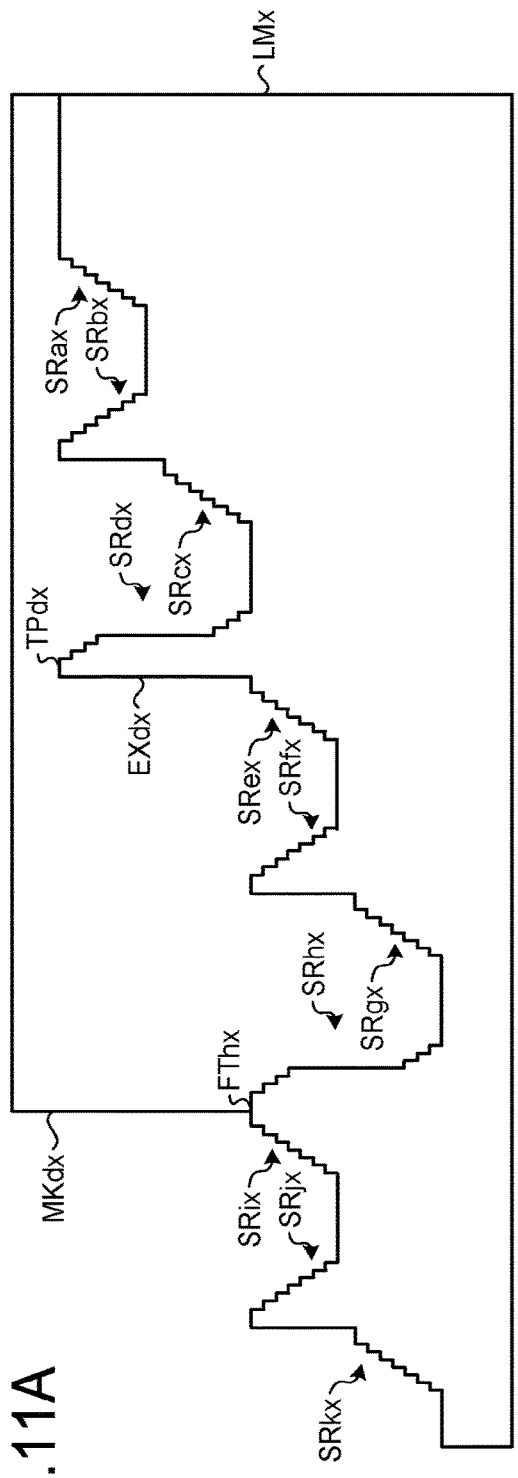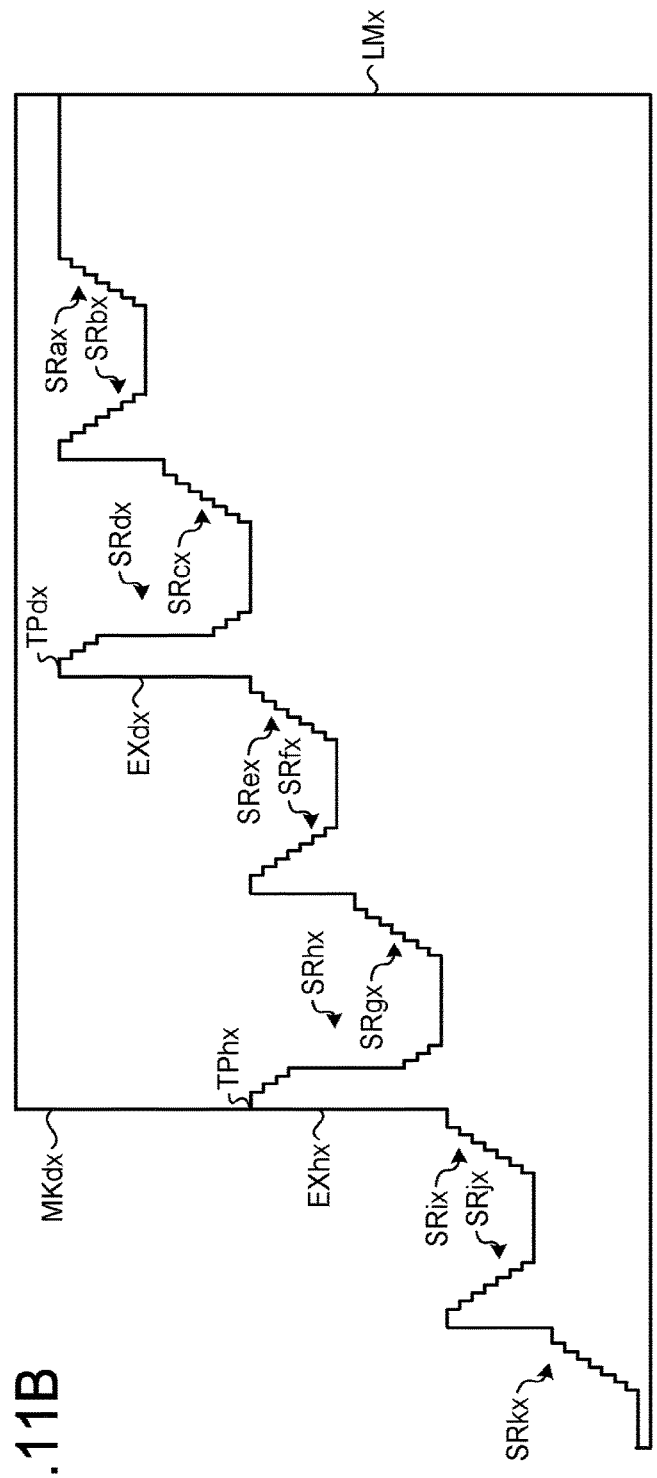

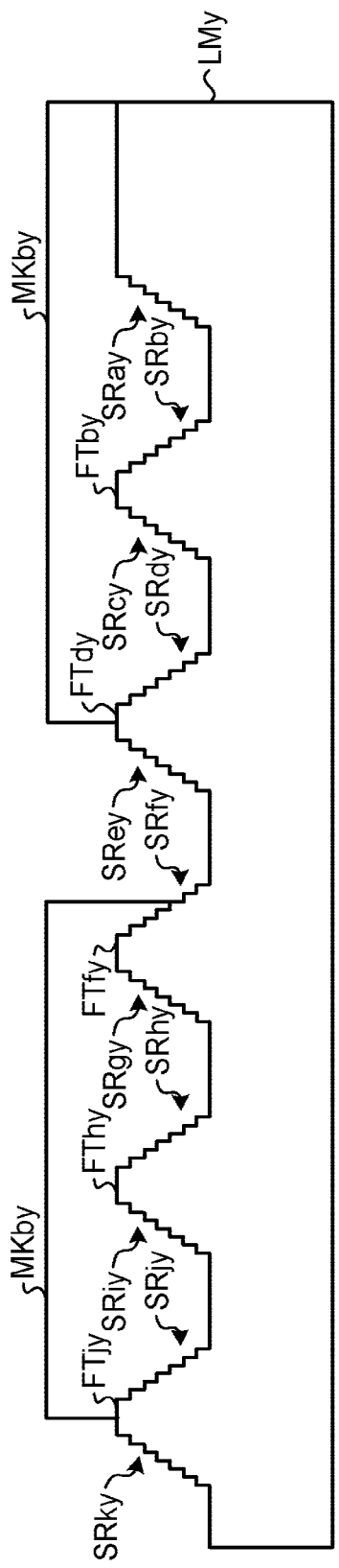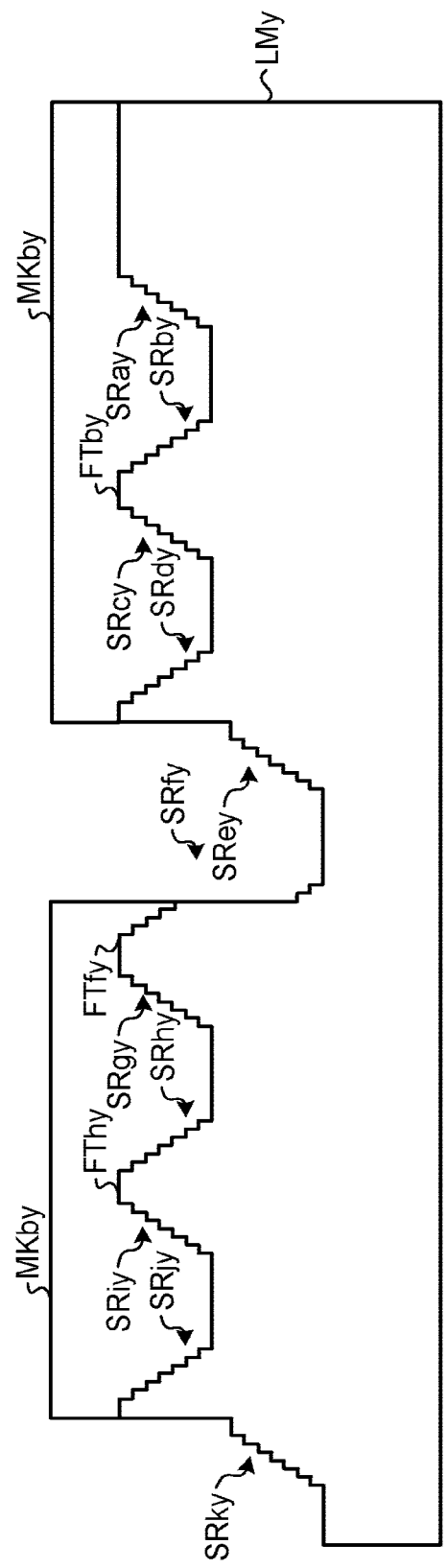

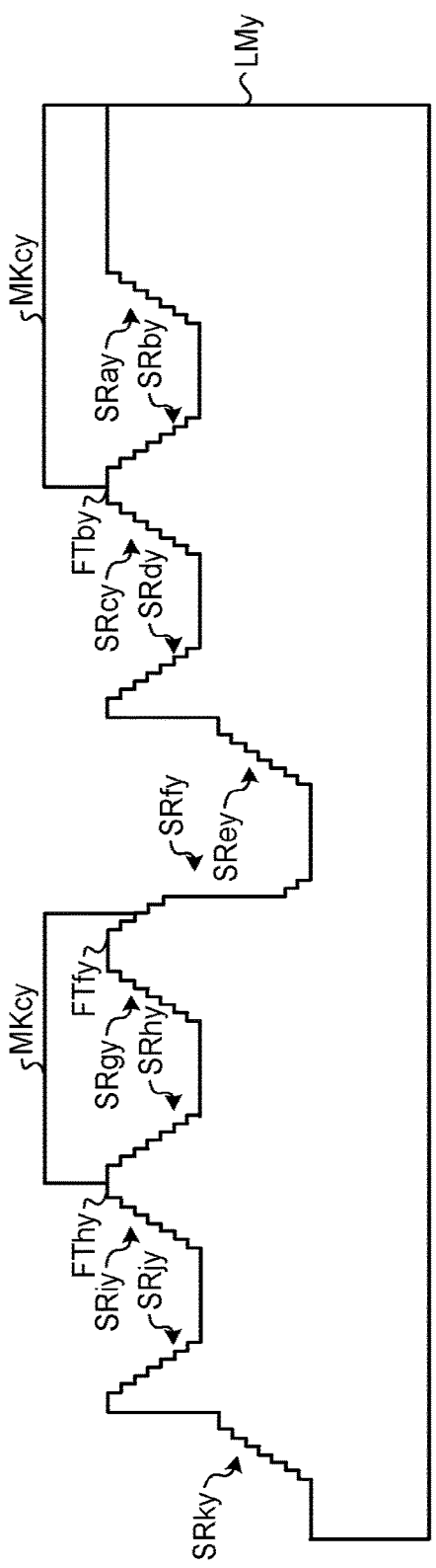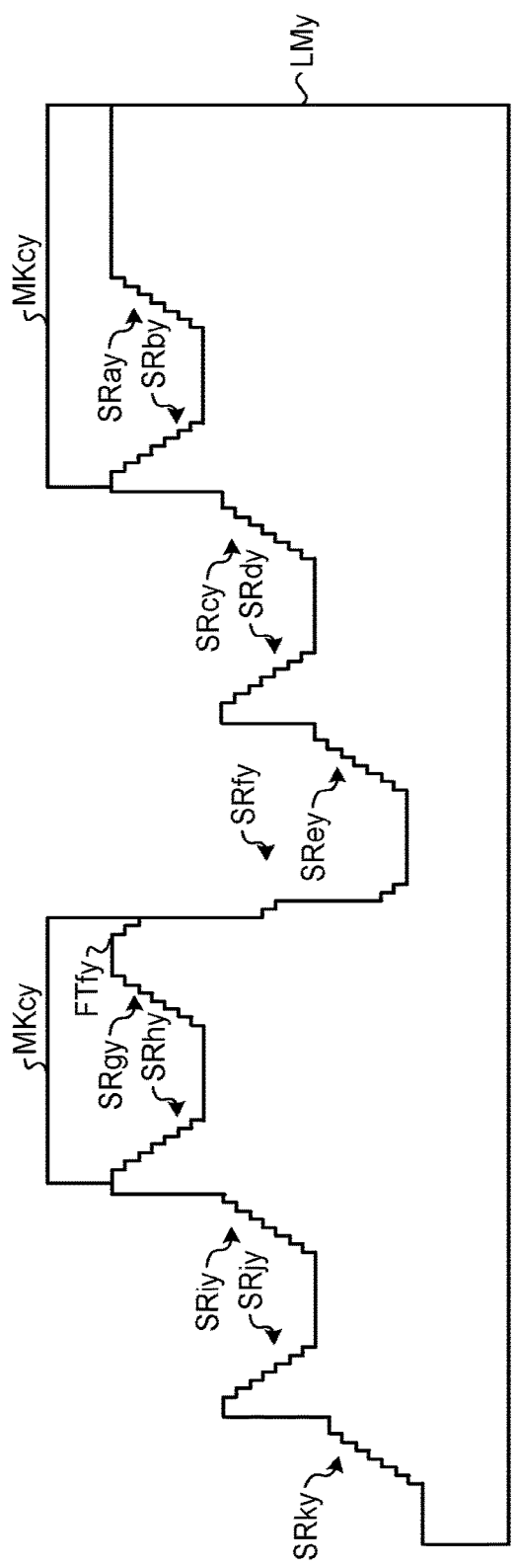

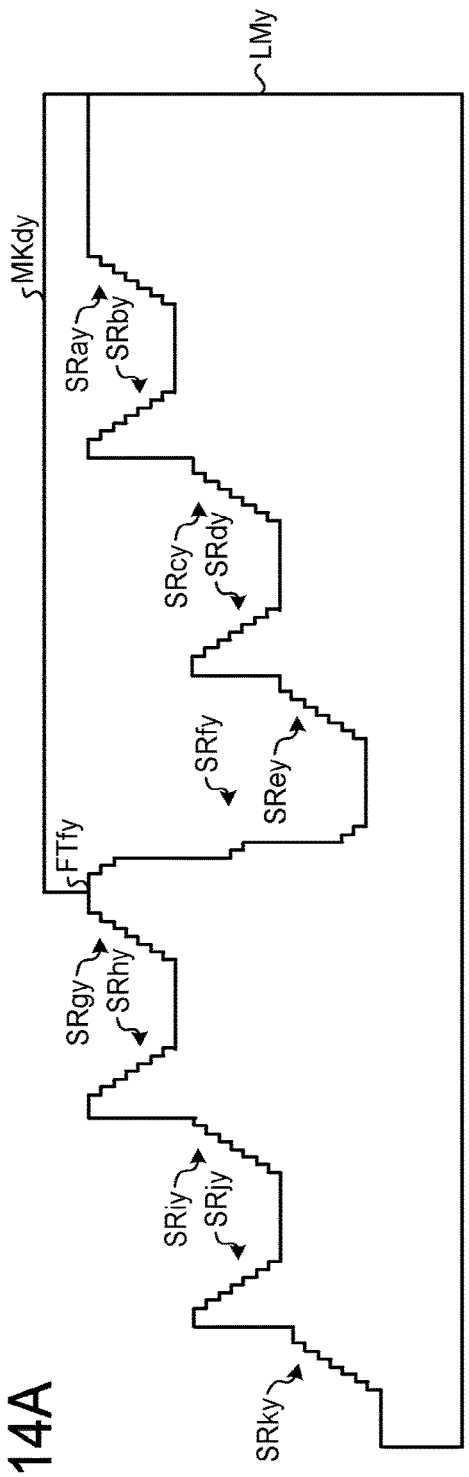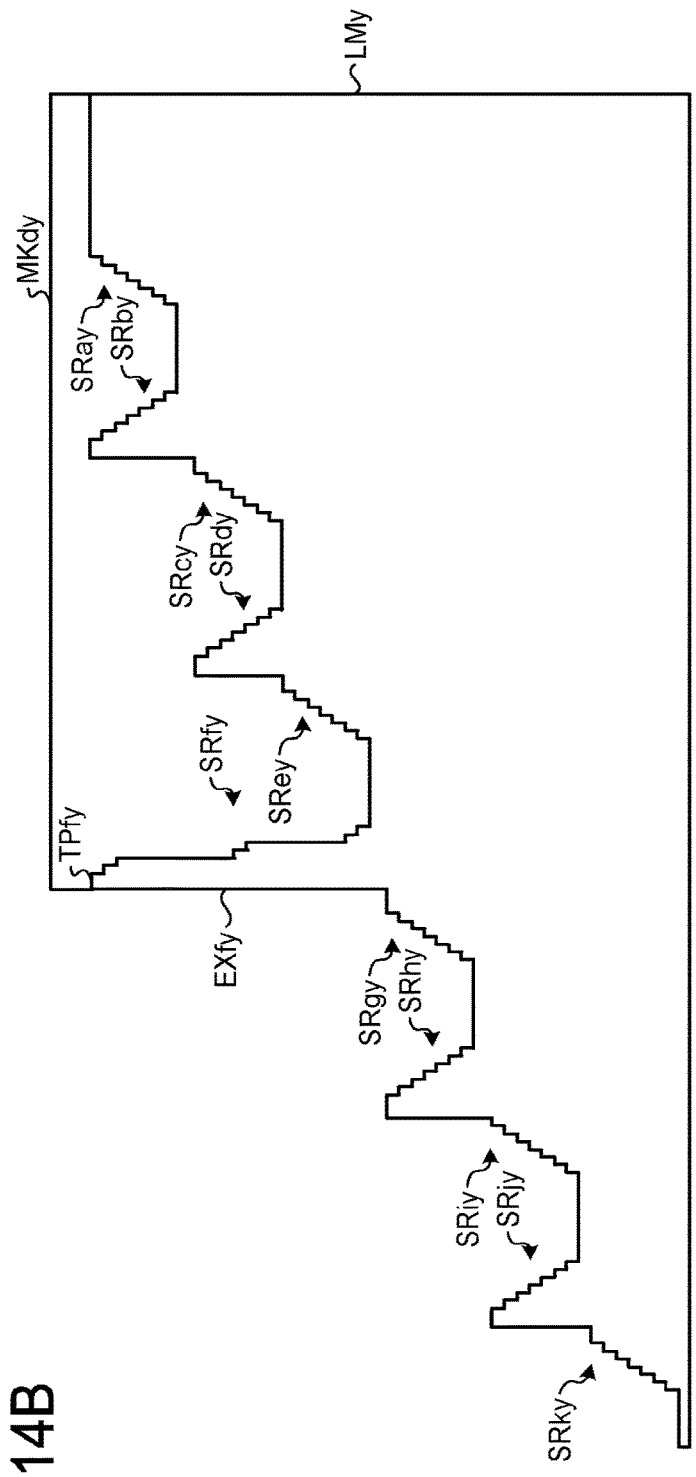

SEMICONDUCTOR STORAGE DEVICE COMPRISING STAIRCASE PORTION

CROSS-REFERENCE TO RELATED APPLICATIONS

This application is a continuation Application of U.S. application Ser. No. 16/809,622, filed on Mar. 5, 2020 (now U.S. Pat. No. 11,264,387), which is based upon and claims the benefit of priority from Japanese Patent Application No. 2019-158388, filed on Aug. 30, 2019; the entire contents of which are incorporated herein by reference.

FIELD

Embodiments described herein relate generally to a semiconductor storage device and a method for manufacturing a semiconductor storage device.

BACKGROUND

In three-dimensional nonvolatile memories, a staircase portion in which end portions of conductive layers form a staircase shape is provided in order to lead out the plurality of stacked conductive layers. It is desired to reduce a staircase length in the staircase portion.

BRIEF DESCRIPTION OF THE DRAWINGS

FIGS. 2A to 2C are cross-sectional views illustrating examples of a procedure of a method for manufacturing the semiconductor storage device according to the embodiment;

FIGS. 3A to 3C are cross-sectional views illustrating examples of the procedure of the method for manufacturing the semiconductor storage device according to the embodiment;

FIGS. 4A to 4D are cross-sectional views illustrating examples of the procedure of the method for manufacturing the semiconductor storage device according to the embodiment;

FIGS. 5A and 5B are cross-sectional views illustrating examples of the procedure of the method for manufacturing the semiconductor storage device according to the embodiment;

FIGS. 11A and 11B are cross-sectional views illustrating examples of the procedure of the method for forming the staircase portion of the semiconductor storage device according to the first modification of the embodiment;

FIGS. 12A and 12B are cross-sectional views illustrating examples of a procedure of a method for forming a staircase portion of a semiconductor storage device according to a second modification of the embodiment;

FIGS. 13A and 13B are cross-sectional views illustrating examples of the procedure of the method for forming the staircase portion of the semiconductor storage device according to the second modification of the embodiment; and FIGS. 14A and 14B are cross-sectional views illustrating examples of the procedure of the method for forming the staircase portion of the semiconductor storage device according to the second modification of the embodiment.

DETAILED DESCRIPTION

A semiconductor storage device according to an embodiment includes: a stacked body in which a plurality of conductive layers are stacked via an insulating layer and which has a memory portion in which a plurality of memory cells are disposed and a staircase portion in which end portions of the plurality of conductive layers form a staircase shape. The staircase portion has three or more first sub-staircase portions ascending in a direction opposite to a direction toward the memory portion, and at least one first sub-staircase portion among the three or more first sub-staircase portions is divided into at least an upper staircase and a lower staircase by a difference in level larger than a difference in level of each stair of the first sub-staircase portion.

Hereinafter, the present invention will be described in detail with reference to the drawings. Incidentally, the present invention is not limited to the following embodiments. In addition, constituent elements in the following embodiments include those that can be easily assumed by those skilled in the art or those that are substantially the same.

(Configuration Example of Semiconductor Storage Device)

Figure 1:
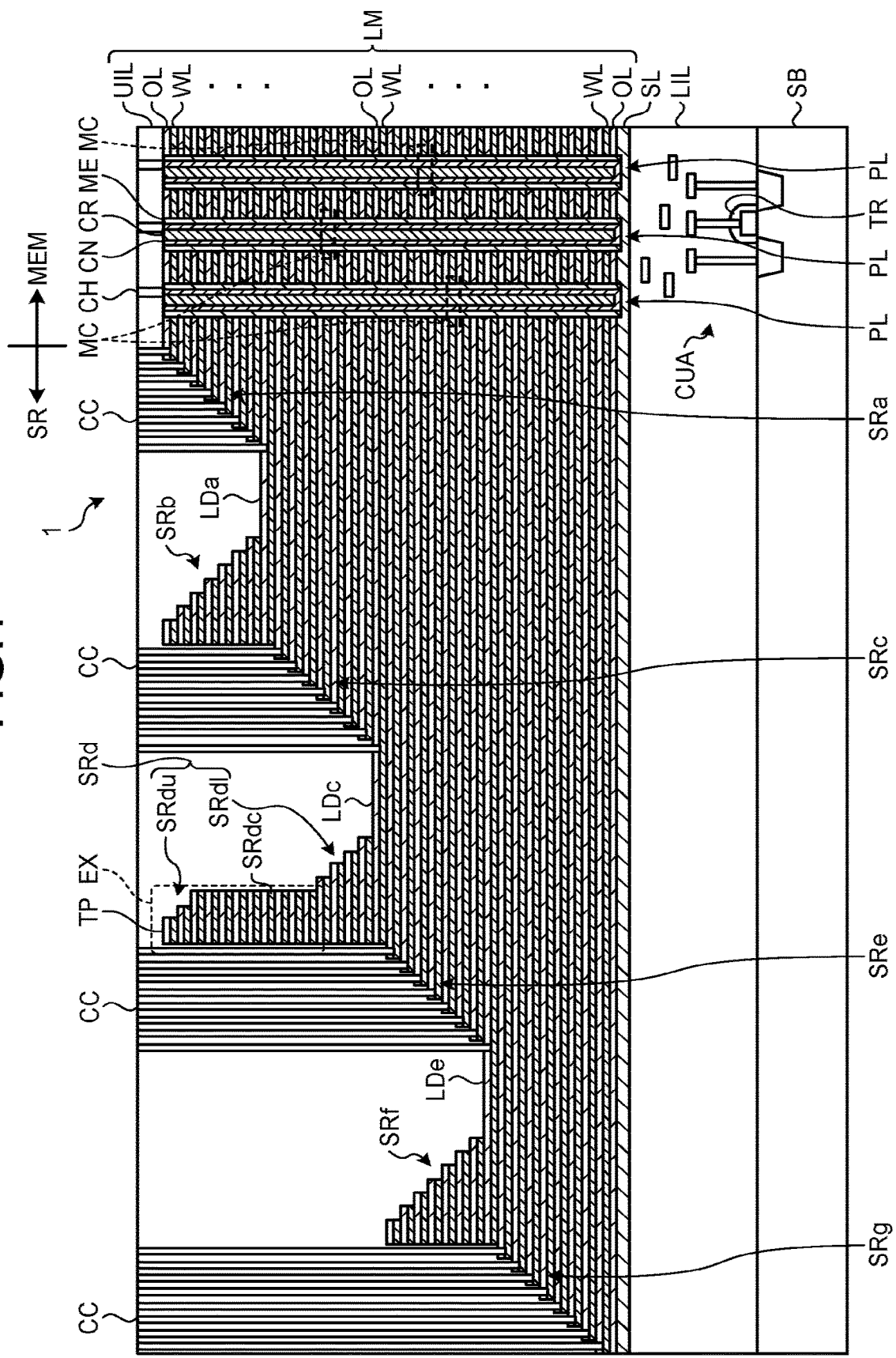
FIG. 1 is a cross-sectional view illustrating a configuration example of a semiconductor storage device according to an embodiment.

FIG. 1 is a cross-sectional view illustrating a configuration example of a semiconductor storage device 1 according to an embodiment. In the present specification, the vertical direction is defined based on a shape of a staircase portion SR to be described below. Specifically, a direction that a terrace portion of the staircase portion SR, that is, an exposed surface of an insulating layer OL in each stair of the staircase portion SR faces is set as an upward direction.

As illustrated in FIG. 1, the semiconductor storage device 1 includes: a memory portion MEM in which a plurality of memory cells MC are disposed in a three-dimensional manner; the staircase portion SR from which a word line WL which is to be connected to the memory cell MC is led out; and a peripheral circuit CUA which contributes to the operation of the memory cell MC.

The peripheral circuit CUA includes a transistor TR disposed on a substrate SB such as a silicon substrate, a contact which is connected to the transistor TR, a wiring, and the like. The entire substrate SB including the peripheral circuit CUA is covered by an interlayer insulating layer LIL. A source line SL is disposed on the interlayer insulating layer LIL. The source line SL is, for example, a polysilicon layer.

The stacked body LM in which a plurality of the word lines WL serving as conductive layers and the insulating layers OL are alternately stacked is disposed on the source line SL. The word line WL is, for example, a tungsten layer or a molybdenum layer. The insulating layer OL is, for example, a $SiO_2$ layer or the like.

Incidentally, the number of the word lines WL included in the stacked body LM is arbitrary. In addition, the stacked body LM may be configured by disposing a select gate line (not illustrated) below the word line WL of the lowermost layer or may be configured by disposing a select gate line (not illustrated) above the word line WL of the uppermost layer.

A plurality of pillars PL are disposed in the stacked body LM. The pillars PL penetrate the stacked body LM in a lamination direction and are disposed in a matrix in the memory portion MEM of the stacked body LM.

Each of the pillars PL has a memory layer ME, a channel layer CN, and a core layer CR in this order from an outer circumference side of the pillar PL. The channel layer CN is also disposed at the bottom of the pillar PL. The memory layer ME is, for example, a layer in which a $SiO_2$ layer/a SiN layer/a $SiO_2$ layer are stacked, the channel layer CN is, for example, an amorphous silicon layer or a polysilicon layer, and the core layer CR is, for example, a $SiO_2$ layer.

The interlayer insulating layer UIL is disposed on the stacked body LM. The channel layer CN of each of the pillars PL is connected to an upper layer wiring (not illustrated) such as a bit line by a plug CH penetrating the interlayer insulating layer UIL.

With the above configuration, the plurality of memory cells MC are formed at intersections between the pillars PL and the word lines WL, respectively. When a predetermined voltage is applied via the word line WL at the same height, data is written to each of the memory cells MC. When a predetermined voltage is applied via the word line WL, data is read from each of the memory cells MC.

The staircase portion SR is disposed in the vicinity of an end portion of the stacked body LM outside the memory portion MEM. The staircase portion SR is configured by terminating the word line WL and the insulating layer OL in a staircase shape. The staircase portion SR is entirely covered by the interlayer insulating layer UIL.

The staircase portion SR has staircase portions SRa to SRg as sub-staircase portions. The staircase portions SRa to SRg are sequentially disposed from the side close to the memory portion MEM to the side far from the memory portion MEM. One stair of the staircase portions SRa to SRg includes one word line WL and one insulating layer OL above this word line WL except for a predetermined stair of the staircase portion SRd.

The staircase portions SRa, SRc, SRe, and SRg ascend toward the memory portion MEM. The staircase portion SRa is constituted by a plurality of upper word lines WL including the uppermost word line WL. The staircase portion SRc is constituted by a plurality of word lines WL below the word lines WL constituting the staircase portion SRa. The staircase portion SRe is constituted by a plurality of word lines WL below the word lines WL constituting the staircase portion SRc. The staircase portion SRg is constituted by a plurality of word lines WL below the word lines WL constituting the staircase portion SRe, the word lines WL including the lowermost word line WL.

Contacts CC are disposed at stairs of the staircase portions SRa, SRc, SRe, and SRg, respectively. Each of the contacts CC penetrates the insulating layer OL constituting a terrace portion of the stair where the corresponding contact CC is disposed, and is connected to the lower word line WL. The contact CC extends through the interlayer insulating layer UIL, and an upper end thereof is connected to, for example, an upper wiring (not illustrated) that receives a signal from the peripheral circuit CUA.

With the above configuration, all the word lines WL included in the stacked body LM are led out in a staircase form and connected to the upper wiring via the contacts CC. In this manner, the staircase portions SRa, SRc, SRe, and SRg are constituted by the word lines WL connected to the contacts CC and the memory cells MC. The staircase portions SRa, SRc, SRe, and SRg are sometimes referred to as real staircases.

The staircase portions SRb and SRf ascend in a direction opposite to the memory portion MEM. The staircase portion SRb is constituted by word lines WL in the same levels as the word lines WL constituting the staircase portion SRa, and opposes the staircase portion SRa with a landing portion LDa interposed therebetween. The staircase portion SRf is constituted by word lines WL in the same levels as the word lines WL constituting the staircase portion SRe, and opposes the staircase portion SRe with a landing portion LDe interposed therebetween.

The staircase portion SRd ascends in the direction opposite to the memory portion MEM. The staircase portion SRd includes a plurality of stairs each of which is constituted by a pair of the word line WL and the insulating layer OL. In addition, the staircase portion SRd has at least one stair constituted by a plurality of the word lines WL and a plurality of the insulating layers OL. Therefore, this stair has a difference in level SRdc larger than a difference in level of each of the other stairs.

The staircase portion SRd includes an upper staircase SRdu and a lower staircase SRdl divided by the difference in level SRdc. In addition, the staircase portion SRd includes a protruding portion EX constituted by the difference in level SRdc and the upper staircase SRdu. A top portion TP of the protruding portion EX has a difference in level generated by the upper staircase SRdu.

The staircase portion SRd is constituted by the word lines WL in the same levels as the word lines WL constituting the staircase portions SRa and SRc, and at least the lower staircase SRdl of the staircase portion SRd opposes the staircase portion SRc with a landing portion LDc interposed therebetween.

The word lines WL constituting the staircase portions SRb, SRd, and SRf are separated from the memory cells MC. The word lines WL constituting the staircase portions SRb, SRd, and SRf are in an electrically floating state, and the staircase portions SRb, SRd, and SRf are invalid regions that do not contribute to the function of the semiconductor storage device 1. The staircase portions SRb, SRd, and SRf are sometimes referred to as dummy staircases.

(Method for Manufacturing Semiconductor Storage Device)

Next, an example of a method for manufacturing the semiconductor storage device 1 according to the embodiment will be described with reference to FIGS. 2A to 8. FIGS. 2A to 8 are cross-sectional views illustrating examples of a procedure of the method for manufacturing the semiconductor storage device 1 according to the embodiment.

As illustrated in FIG. 2A, the peripheral circuit CUA including the transistor TR and the like is formed on the substrate SB such as a silicon substrate. The peripheral circuit CUA is covered by the interlayer insulating layer LIL.

As illustrated in FIG. 2B, the source line SL is formed on the interlayer insulating layer LIL.

As illustrated in FIG. 2C, a stacked body LMs in which a plurality of sacrificial layers NL serving as a plurality of insulating layers and a plurality of insulating layers OL are alternately stacked is formed on the source line SL. The sacrificial layer NL is, for example, a SiN layer or the like, and is a layer that can be replaced with the word line WL later.

A staircase portion SR is formed in the vicinity of an end portion of the stacked body LMs. A method for forming the staircase portion SR will be described later.

As illustrated in FIG. 3A, a plurality of memory holes MH which penetrate through the stacked body LMs and reach the source line SL are formed.

As illustrated in FIG. 3B, the memory layer ME is stacked on an inner wall of each of the memory holes MH. More specifically, a block insulating layer BK such as a $SiO_2$ layer, a charge storage layer CT such as a SiN layer, and a tunnel insulating layer TN such as a $SiO_2$ layer are formed from the inner wall side of the memory hole MH. The block insulating layer BK, the charge storage layer CT, and the tunnel insulating layer TN constitute the memory layer ME.

As illustrated in FIG. 3C, the channel layer CN is formed on an inner wall of the tunnel insulating layer TN. The channel layer CN is also formed at the bottom of the memory hole MH. A hollow on the inner side of the channel layer CN is filled with the core layer CR. As a result, the pillar PL is formed.

Next, the method for forming the staircase portion SR will be described. Incidentally, FIGS. 4A to 5B do not illustrate a lower structure including a part of the stacked body LMs.

As illustrated in FIG. 4A, a plurality of island-like mask patterns MKa are formed on the stacked body LMs. The mask pattern MKa is, for example, a resist pattern made of a photosensitive resin.

As illustrated in FIG. 4B, slimming is performed with $O_2$ plasma or the like such that a width of the mask pattern MKa is gradually narrowed. In addition, a pair of the insulating layer OL and the sacrificial layer NL is removed from an upper layer to a lower layer of the stacked body LMs each time the mask pattern MKa is slimmed. As a result, a staircase-like shape is formed from a skirt portion of the mask pattern MKa toward a lower layer of the stacked body LMs. That is, staircase portions SRas to SRgs in the middle of processing are formed.

These staircase portions SRas to SRgs are all positioned at the same level in the stacked body LMs, and the staircase portions SRas and SRbs, the staircase portions SRcs and SRds, and the staircase portions SRes and SRfs oppose each other with landing portions LDas, LDcs, and LDes interposed therebetween, respectively.

Next, lowering step by multi-stage processing is performed such that these staircase portions SRas to SRgs are positioned at different levels.

As illustrated in FIG. 4C, a plurality of island-like mask patterns MKb are formed on the stacked body LMs. The mask pattern MKb is, for example, a resist pattern made of a photosensitive resin.

One island of the mask pattern MKb is formed so as to cover the staircase portions SRas and SRbs and the landing portion LDas. One end portion of the mask pattern MKb is disposed in a flat portion FTbs between the staircase portions SRbs and SRcs.

Another island of the mask pattern MKb is formed so as to cover a part of the staircase portion SRds, the staircase portions SRes and SRfs, and the landing portion LDes. One end portion of the mask pattern MKb is disposed in a flat portion FTfs between the staircase portions SRfs and SRgs.

The other end portion of the mask pattern MKb covers a flat portion FTds between the staircase portions SRds and SRes, and is disposed in the middle of the staircase portion SRds.

As illustrated in FIG. 4D, the exposed staircase portions SRcs, SRds, and SRgs and the landing portion LDcs are dug down using the mask pattern MKb as a mask while maintaining the staircase shape. As a result, the staircase portions SRcs, SRds, and SRgs are constituted by the insulating layers OL and the sacrificial layers NL which are lower than the insulating layers OL and the sacrificial layers NL constituting the staircase portions SRas, SRbs, SRes, and SRfs.

At this time, the flat portions FTbs and FTfs are partially scraped and belong to the lower staircase portions SRcs and SRgs, respectively.

In addition, lower stairs of the staircase portion SRds are scraped at this time, and the staircase portion SRds has a difference in level SRdcs and an upper staircase SRdus and a lower staircase SRdls divided by the difference in level SRdcs. The flat portion FTds is protected by the mask pattern MKb and remains as it is.

As illustrated in FIGS. 4C and 4D, processing a large number of stairs at once to position the staircase portions SRcs, SRds, and SRgs in lower layers is sometimes referred to as lowering step by multi-stage processing.

As illustrated in FIG. 5A, a mask pattern MKc is formed. The mask pattern MKc is, for example, a resist pattern made of a photosensitive resin.

The mask pattern MKc covers the staircase portions SRas to SRds and landing portions LDas and LDcs. One end portion of the mask pattern MKc is disposed in the flat portion FTds between the staircase portions SRds and SRes.

As illustrated in FIG. 5B, the exposed staircase portions SRes to SRgs and landing portions LDes are lowered by multi-stage processing using the mask pattern MKc as a mask while maintaining the staircase shape. As a result, the staircase portions SRes to SRgs are constituted by the insulating layers OL and the sacrificial layers NL which are lower than the insulating layers OL and the sacrificial layers NL constituting the staircase portions SRas to SRds.

At this time, the flat portion FTds is partially scraped and belongs to the lower staircase portion SRes. As a result, a protruding portion EXs having a top portion TPs is formed in the staircase portion SRds. The top portion TPs of the protruding portion EXs has a difference in level generated by the upper staircase SRdus of the staircase portion SRds.

As above, the formation of the staircase portions SRas to SRgs is terminated. As described above, the staircase portions SRas to SRgs belonging to different levels, respectively, are formed by performing the lowering step by multi-stage processing twice.

Figure 6:
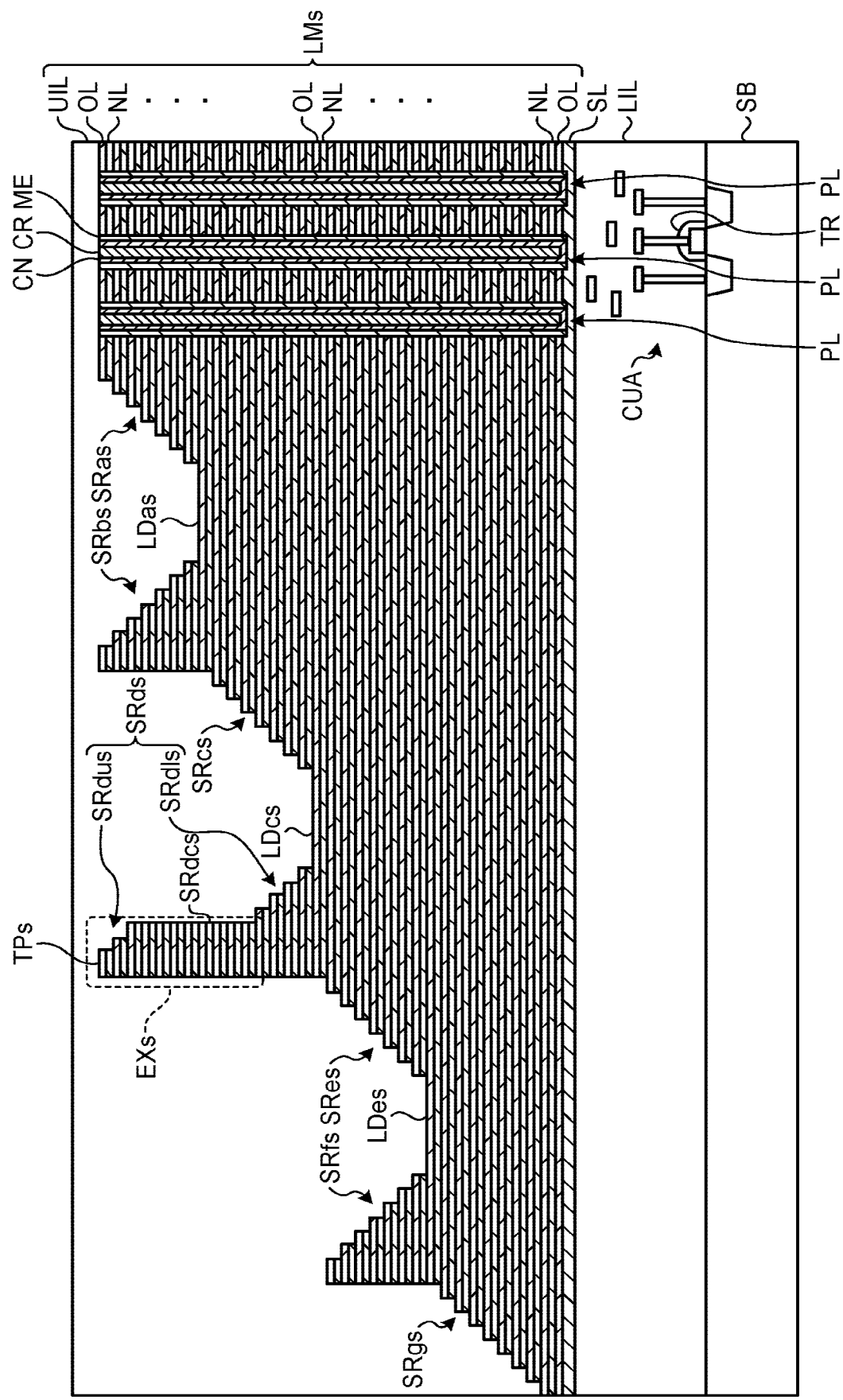
FIG. 6 is a cross-sectional view illustrating an example of the procedure of the method for manufacturing the semiconductor storage device according to the embodiment.

As illustrated in FIG. 6, the interlayer insulating layer UIL that covers the entire stacked body LMs including the staircase portions SRas to SRgs is formed after the pillar PL is formed as described above. In addition, a slit (not illustrated) is formed. The slit has a groove-shaped configuration that penetrates the stacked body LMs along the cross-sectional direction of FIG. 6.

Figure 7:
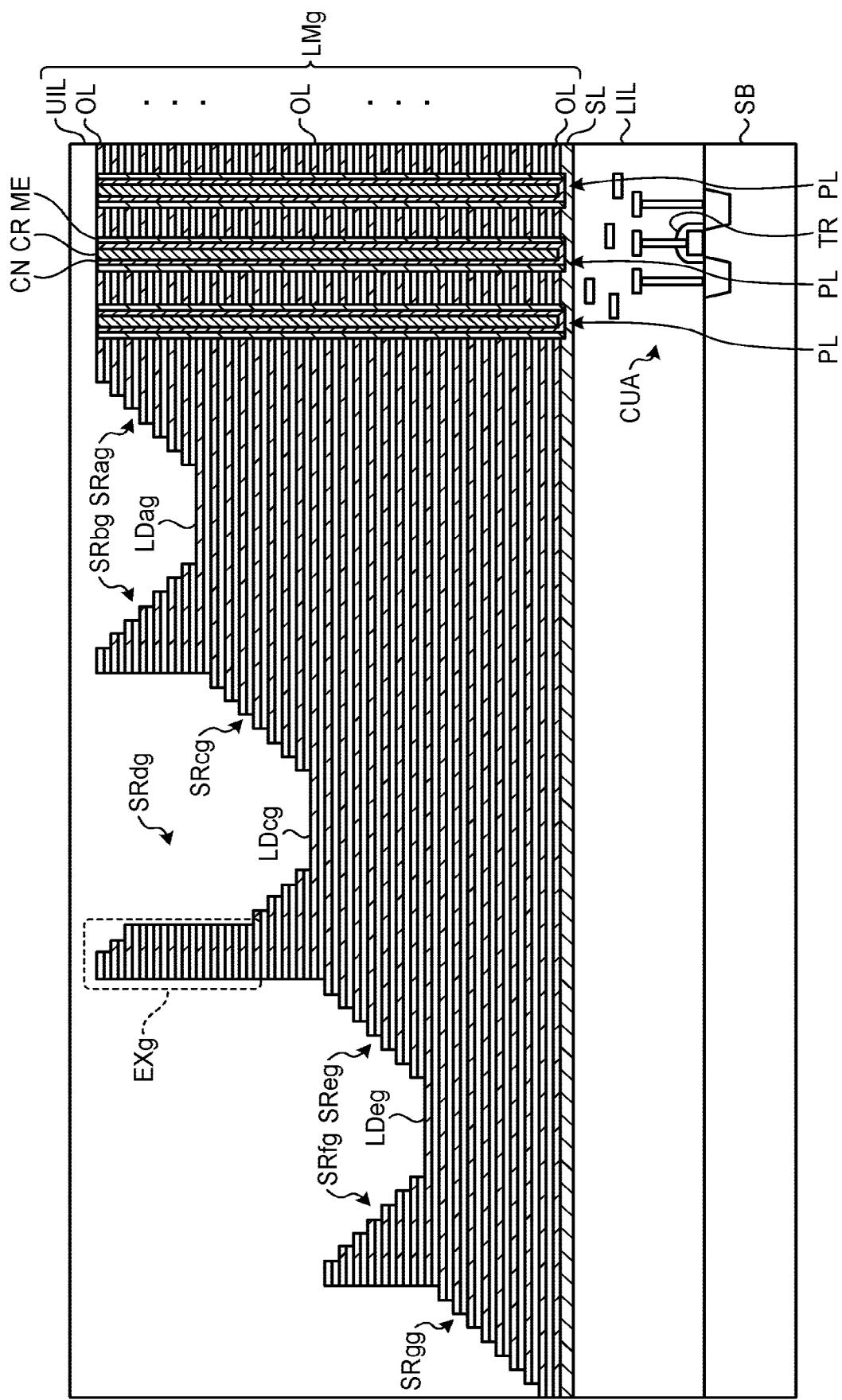
FIG. 7 is a cross-sectional view illustrating an example of the procedure of the method for manufacturing the semiconductor storage device according to the embodiment.

As illustrated in FIG. 7, the sacrificial layer NL of the stacked body LMs is removed through the slit. As a result, a stacked body LMg having gaps between the insulating layers OL is formed. In addition, at this time, staircase portions SRag to SRgg including gaps, landing portions LDag, LDcg, and LDeg, and a protruding portion EXg including gaps are formed.

Figure 8:
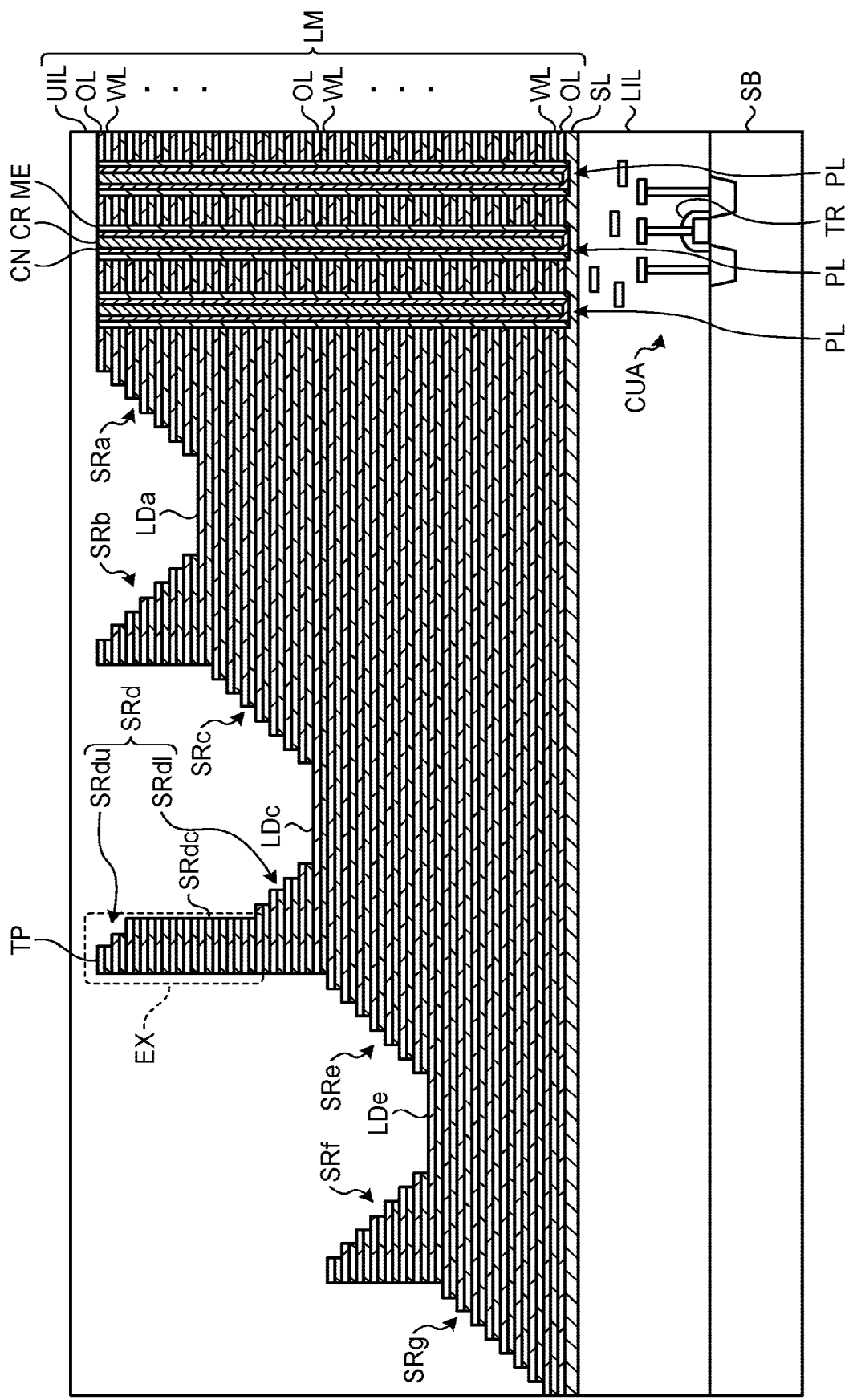
FIG. 8 is a cross-sectional view illustrating an example of the procedure of the method for manufacturing the semiconductor storage device according to the embodiment.

As illustrated in FIG. 8, the gaps of the stacked body LMg are filled with a conductive material such as tungsten and molybdenum through the slit to form the word line WL. As a result, the stacked body LM having the staircase portions SRa to SRg, the landing portions LDa, LDc, and LDe, and the protruding portion EX are formed.

Incidentally, the process of replacing the sacrificial layer NL with the word line WL as illustrated in FIGS. 7 and 8 is sometimes referred to as replacement.

Thereafter, the plug CH is connected to the pillar PL, the contacts CC are connected to the staircase portions SRa to SRg, and further, the upper wiring thereof is formed.

As described above, the semiconductor storage device 1 of the embodiment is manufactured.

In a method for manufacturing a semiconductor storage device such as a three-dimensional nonvolatile memory, a staircase structure is generally formed so as to lead out word lines stacked in multiple layers. At this time, a technique of adding a difference in level in order from the uppermost layer to the lowermost layer at an end portion of a stacked body requires a large number of steps so that a manufacturing load is high. Therefore, a technique is conceivable in which a plurality of sub-staircase portions are formed on the same level and the sub-staircase portions are processed to belong to different levels using the lowering step by multi-stage processing.

When the lowering step is performed, a flat portion between the sub-staircase portions is used to secure a margin for lithography of a mask pattern and subsequent etching. For example, in a method for manufacturing a semiconductor storage device according to a comparative example, alignment is performed such that an end portion of a mask pattern is disposed in flat portions between sub-staircase portions during twice lowering steps. The end portion of the mask pattern is disposed on a flat portion, which is to be a top portion of a protruding portion later, out of the flat portions over the twice lowering steps. In this case, the flat portion is formed to be wide such that a margin for the twice lowering steps can be sufficiently obtained, a staircase length of the entire staircase portion tends to be long.

Incidentally, the protruding portion is also formed in the method for manufacturing the semiconductor storage device according to the comparative example, the sub-staircase portion having the protruding portion is not divided, and the top portion of the protruding portion has no difference in level.

According to the semiconductor storage device 1 of the embodiment, the end portion of the mask pattern MKb is not disposed in the flat portion FTds between the staircase portions SRds and SRes in the first lowering step between the twice lowering steps. Instead, the staircase portion SRds, which is the dummy staircase, is used for lithography alignment. As a result, it is sufficient for the flat portion FTds to have a width that allows a margin to be obtained in one-time lithography and etching using the mask pattern MKc, and the flat portion FTds can be designed to be narrow. Accordingly, the staircase length of the entire staircase portion SR can be reduced.

(First Modification)

The above configuration can be applied even when the number of sub-staircase portions is increased. A method for forming staircase portions SRax to SRkx of a semiconductor storage device according to a first modification of the embodiment will be described with reference to FIGS. 9A to 11B. FIGS. 9A to 11B are cross-sectional views illustrating examples of a procedure of the method for forming the staircase portions SRax to SRkx of the semiconductor storage device according to the first modification of the embodiment.

Figure 9A:
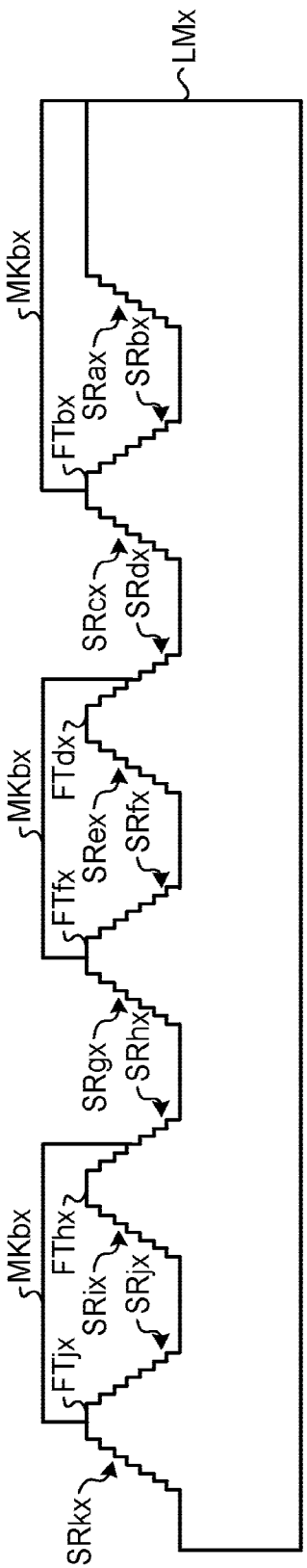
FIGS. 9A and 9B are cross-sectional views illustrating examples of a procedure of a method for forming a staircase portion of a semiconductor storage device according to a first modification of the embodiment.

As illustrated in FIG. 9A, the staircase portions SRax to SRkx are formed at the same level position in a stacked body LMx by the processing corresponding to FIGS. 4A and 4B of the above-described embodiment. Island-like mask patterns MKbx is formed on the stacked body LMx.

One end portions of the island-shaped mask patterns MKbx are disposed respectively in flat portions FTbx, FTfx, and FTjx among the predetermined staircase portions SRax to SRkx. The other end portions of the mask patterns MKbx are disposed in the middle of the staircase portions SRdx and SRhx so as to cover the flat portions FTdx and FThx, respectively.

Figure 9B:
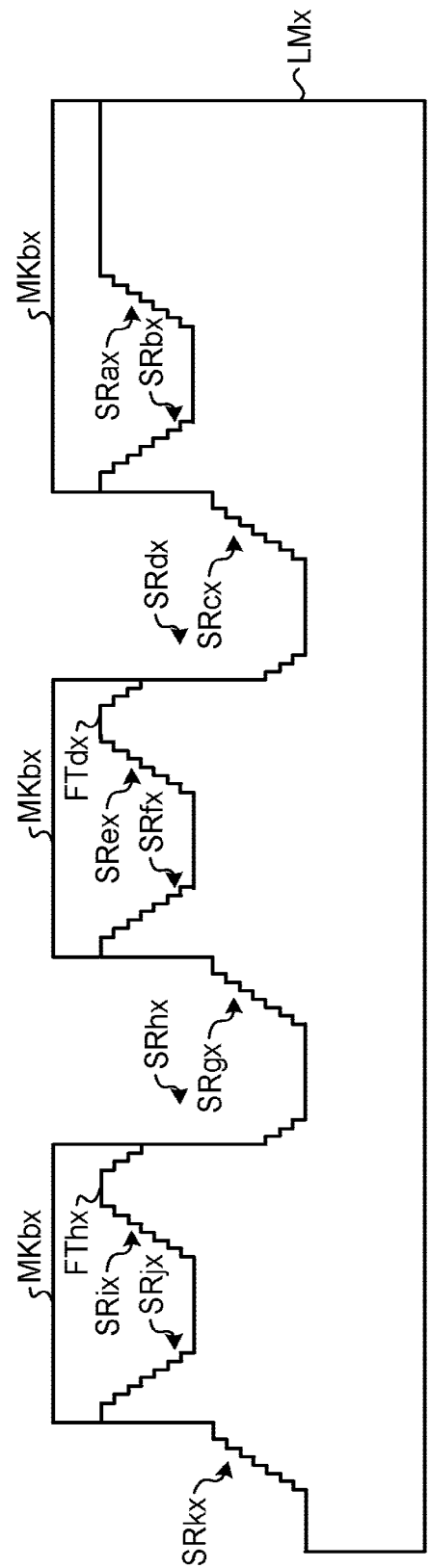

As illustrated in FIG. 9B, exposed staircase portions SRcx, SRgx, SRkx are lowered to a lower level position by multi-stage processing using the mask pattern MKbx as a mask. In addition, lower layer portions of the staircase portions SRdx and SRhx are also lowered, and each of the staircase portions SRdx and SRhx is divided into two parts.

Figure 10A:
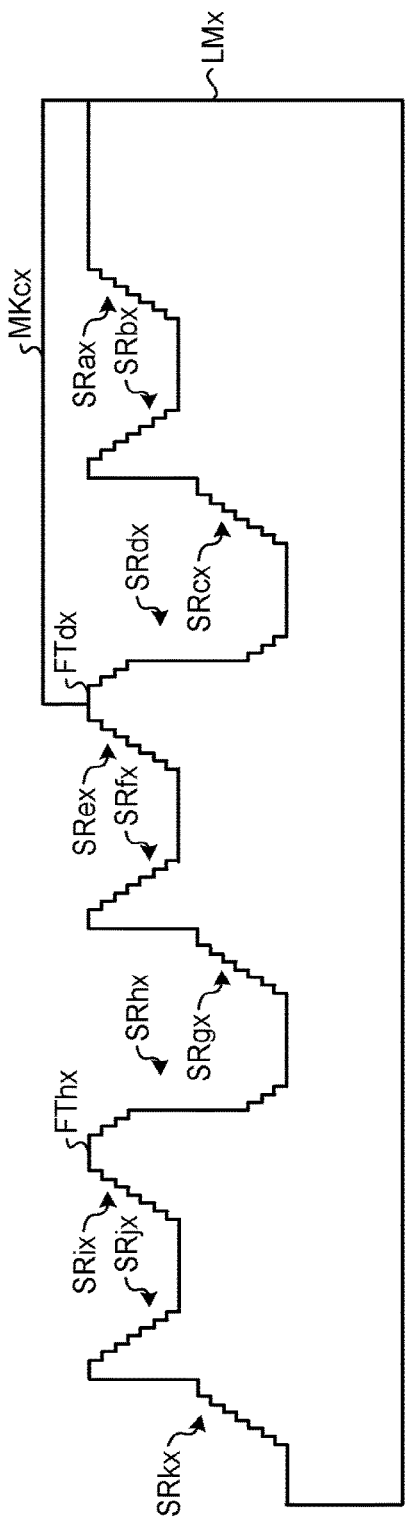
FIGS. 10A and 10B are cross-sectional views illustrating examples of the procedure of the method for forming the staircase portion of the semiconductor storage device according to the first modification of the embodiment.

As illustrated in FIG. 10A, a mask pattern MKcx is formed. One end portion of the mask pattern MKcx is disposed in a flat portion FTdx between the staircase portions SRdx and SRex.

Figure 10B:
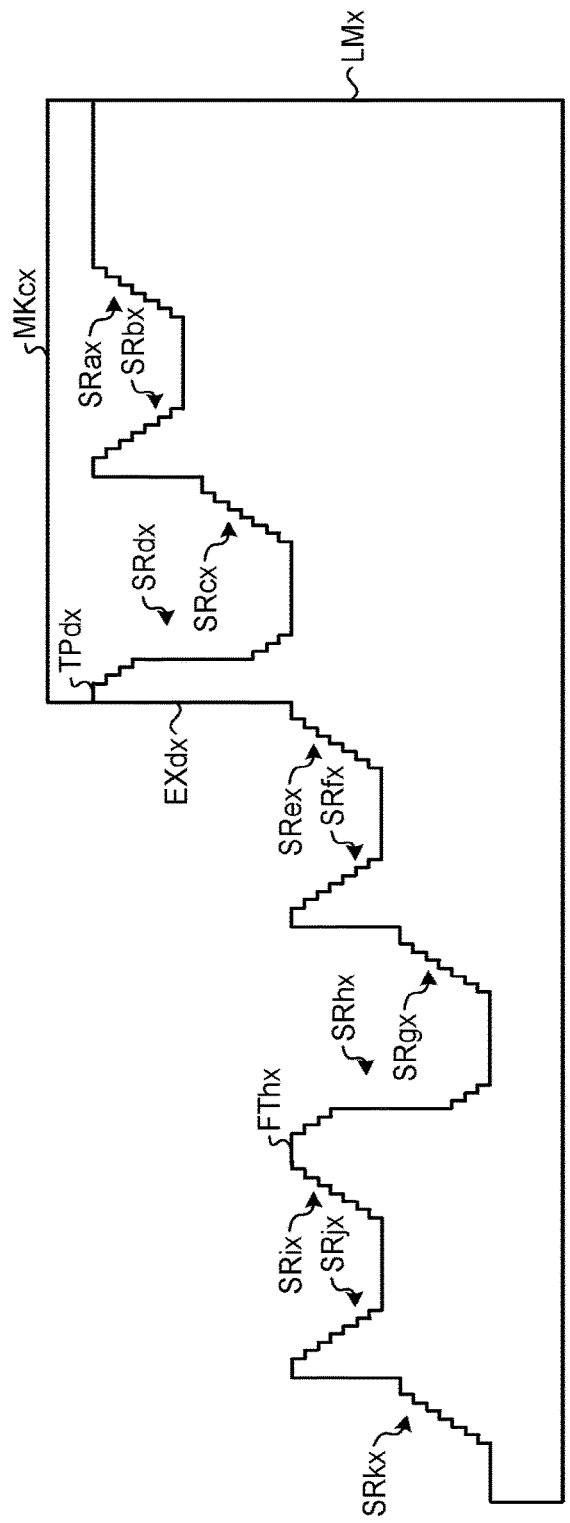

As illustrated in FIG. 10B, the exposed staircase portions SRex to SRkx are lowered to a lower level position by multi-stage processing using the mask pattern MKcx as a mask. As a result, a protruding portion EXdx having a top portion TPdx with a difference in level is formed in the staircase portion SRdx.

As illustrated in FIG. 11A, a mask pattern MKdx is formed. One end portion of the mask pattern MKdx is disposed in the flat portion FThx between the staircase portions SRhx and SRix.

As illustrated in FIG. 11B, the exposed staircase portions SRix to SRkx are lowered to a lower level position by multi-stage processing using the mask pattern MKdx as a mask. As a result, a protruding portion EXhx having a top portion TPhx with a difference in level is formed in the staircase portion SRhx.

As above, the formation of the staircase portions SRax to SRkx is terminated. As described above, the staircase portions SRax to SRkx belonging to different levels, respectively, are formed by performing the lowering step by multi-stage processing three times. In addition, the staircase portions SRdx and SRhx which are divided into two parts and have the protruding portions EXdx and EXhx, respectively, are formed.

In the method for forming the staircase portions SRax to SRkx, the flat portion FTdx can be used for the alignment of the mask patterns MKbx and MKcx twice out of the three times of lowering steps. However, the flat portion FTdx can be designed to be narrow by aligning the mask pattern MKbx once using the staircase portion SRdx.

In addition, in the method for forming the staircase portions SRax to SRkx, the flat portion FThx can be used for the alignment of the mask patterns MKbx and MKdx twice out of the three times of lowering steps. However, the flat portion FThx can be designed to be narrow by aligning the mask pattern MKbx once using the staircase portion SRhx.

(Second Modification)

In the above-described embodiment and first modification, two real staircases are grouped as one set, one of the two real staircases is lowered, and then, two real staircases belonging to the same set are lowered together.

That is, in the embodiment, the staircase portions SRas to SRgs are grouped into a set of the staircase portions SRas and SRcs and a set of the staircase portions SRes and SRgs, the staircase portions SRcs and SRgs, each of which is one of the set, are lowered, and then, the two staircase portions SRes and SRgs belonging to the same set are lowered together.

In addition, in the first modification, the staircase portions SRax to SRkx are grouped into a set of the staircase portions SRax and SRcx, a set of the staircase portions SRex and SRgx, and a set of the staircase portions SRix and SRkx, the staircase portions SRcx, SRgx, and SRkx, each of which is one of the set, are lowered, and then, the staircase portions SRex and SRgx belonging to the same set and the staircase portions SRix and SRkx belonging to the same set are lowered together, and further, the staircase portions SRix and SRkx belonging to the same set are lowered.

In the second modification of the embodiment, three real staircases are grouped as one set, the lowering is sequentially performed within the set, and then, the three real staircases belonging to the same set are lowered together.

A method for forming staircase portions SRay to SRky of a semiconductor storage device according to the second modification of the embodiment will be described with reference to FIGS. 12A to 14B. FIGS. 12A to 14B are cross-sectional views illustrating examples of a procedure of the method for forming the staircase portions SRay to SRky of the semiconductor storage device according to the second modification of the embodiment.

As illustrated in FIG. 12A, the staircase portions SRay to SRky are formed at the same level position in a stacked body LMy by the processing corresponding to FIGS. 4A and 4B of the above-described embodiment. Island-like mask patterns MKby is formed on the stacked body LMy.

One end portions of the mask patterns MKby are disposed respectively in flat portions FTdy and FTjy among the predetermined staircase portions SRay to SRky. The other end portion of the mask pattern MKby is disposed in the middle of the staircase portion SRfy.

As illustrated in FIG. 12B, the exposed staircase portions SRey and SRky are lowered to a lower level position by multi-stage processing using the mask pattern MKby as a mask. In addition, lower layer portions of the staircase portion SRfy are lowered, and the staircase portion SRfy is divided into two parts.

As illustrated in FIG. 13A, island-shaped mask patterns MKcy are formed. One end portions of the mask patterns MKcy are disposed in a flat portion FTby between the staircase portions SRby and SRcy and a flat portion FThy between the staircase portions SRhy and SRiy. The other end portion of the mask pattern MKcy is disposed in the middle of the staircase portion SRfy.

As illustrated in FIG. 13B, the exposed staircase portions SRcy to SRey and SRiy to SRky are further lowered to a lower level position by multi-stage processing using the mask pattern MKcy as a mask. In addition, a part of a lower staircase of the staircase portion SRfy divided into two parts is further lowered, and the staircase portion SRfy is divided into three parts. That is, the staircase portion SRfy has three staircases of a lower staircase, a middle staircase, and an upper staircase.

As illustrated in FIG. 14A, a mask pattern MKdy is formed. One end portion of the mask pattern MKdy is disposed in a flat portion FTfy between the staircase portions SRfy and SRgy.

As illustrated in FIG. 14B, the exposed staircase portions SRgy to SRky are lowered to a lower level position by multi-stage processing using the mask pattern MKdy as a mask. As a result, a protruding portion EXfy having a top portion TPfy with a difference in level is formed in the staircase portion SRfy.

As above, the formation of the staircase portions SRay to SRky is terminated. As described above, the staircase portions SRay to SRky belonging to different levels, respectively, are formed by performing the lowering step by multi-stage processing three times. In addition, the staircase portion SRfy divided into three parts and having the protruding portion EXfy is formed.

In the method for forming the staircase portions SRay to SRky, the flat portion FTfy can be used for the alignment of the mask patterns MKby to MKdy three times during the three times of lowering steps. However, the flat portion FTfy can be designed to be narrow by aligning the mask patterns MKby and MKcy twice using the staircase portion SRfy.

As described above, the number of protruding portions and the number of divisions of sub-staircase portions having the protruding portions vary depending on the number of sub-staircase portions and the lowering step technique. That is, the number of protruding portions and the number of divisions of sub-staircase portions are arbitrary regardless of the examples of the embodiment and the first and second modifications.

Incidentally, the peripheral circuit CUA is disposed below the memory portion MEM in the semiconductor storage devices according to the above-described embodiment and first and second modifications, but the invention is not limited thereto. The memory portion and the staircase portion may be disposed immediately above the substrate, and the peripheral circuit may be disposed outside the memory portion and the staircase portion. Alternatively, a peripheral circuit may be disposed above the memory portion and the staircase portion.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising
a stacked body in which above a substrate, a plurality of conductive layers are stacked in a stacking direction via an insulating layer, the stacked body including a memory region in which a plurality of memory cells are disposed and a staircase region which includes a first region and in which end portions of the plurality of conductive layers form a staircase shape, wherein
the first region of the staircase region includes a first sub-staircase portion ascending in a first direction toward the memory region, and a second sub-staircase portion disposed side by side with the first sub-staircase portion without interposing the plurality of conductive layers between the first and second sub-staircase portions, in a second direction opposite to the first direction from the first sub-staircase portion, the second sub-staircase portion ascending in the second direction, a shape of the end portions of the plurality of conductive layers located in the first direction in the first region being asymmetric to a shape of the end portions of the plurality of conductive layers located in the second direction in the first region, the end portions of the plurality of conductive layers in the first region forming a part of the staircase shape, the second sub-staircase portion includes a lower staircase portion, an upper staircase portion, and an intermediate difference in level between the lower staircase portion and the upper staircase portion, the intermediate difference in level including a first number of layers, each stair of the lower staircase portion including a second number of layers, each stair of the upper staircase portion including a third number of layers, and the first number being larger than the second number and than the third number, in the first sub-staircase portion and the lower and upper staircase portions of the second sub-staircase portion, each stair has a terrace portion that does not overlap in the stacking direction with an upper conductive layer of a conductive layer including the stair itself among the plurality of conductive layers, and the intermediate difference in level extends in a direction crossing a surface formed by the terrace portion and no terrace portion is disposed in the intermediate difference in level.

2. The semiconductor storage device according to claim 1, wherein the lower staircase portion of the second sub-staircase portion is provided symmetrically to a part of the first sub-staircase portion in the second direction.

3. The semiconductor storage device according to claim 2, wherein
a number of conductive layers in the part of the first sub-staircase portion and a number of conductive layers in the lower staircase portion of the second sub-staircase portion are equal to each other, and
a number of conductive layers in a residual part of the first sub-staircase portion and a number of conductive layers in the upper staircase portion of the second sub-staircase portion are equal to each other.

4. The semiconductor storage device according to claim 3, wherein the residual part of the first sub-staircase portion is opposed to a lower portion of the intermediate difference in level of the second sub-staircase portion in the first direction.

5. The semiconductor storage device according to claim 1, wherein
the staircase region further includes a second region disposed between the memory region and the first region, and an intermediate region disposed between the first region and the second region, the second region including a third sub-staircase portion ascending in the first direction and disposed, in the stacked body, on an upper side of the first sub-staircase portion, and a fourth sub-staircase portion disposed side by side with the third sub-staircase portion in the second direction from the third sub-staircase portion and ascending in the second direction, and
the intermediate region includes an uppermost conductive layer of the plurality of conductive layers.

6. The semiconductor storage device according to claim 5, wherein a number of conductive layers in the third sub-staircase portion is equal to a number of conductive layers in the first sub-staircase portion.

7. The semiconductor storage device according to claim 5, wherein the stacked body has a first difference in level between the first sub-staircase portion and the intermediate region.

8. The semiconductor storage device according to claim 7, wherein a magnitude of the first difference in level is substantially equal to a magnitude of the intermediate difference in level.

9. The semiconductor storage device according to claim 1, wherein in the first sub-staircase portion, a contact connected to a conductive layer included in the first sub-staircase portion among the plurality of conductive layers is disposed.

10. The semiconductor storage device according to claim 9, wherein the conductive layer included in the first sub-staircase portion is coupled to a memory cell among the plurality of memory cells.

11. The semiconductor storage device according to claim 10, wherein a portion of a conductive layer included in the second sub-staircase portion among the plurality of conductive layers is not coupled to any memory cell among the plurality of memory cells.

12. A semiconductor storage device comprising
a stacked body in which above a substrate, a plurality of conductive layers are stacked in a stacking direction via an insulating layer, the stacked body including a memory region in which a plurality of memory cells are disposed and a staircase region which includes a first region and in which end portions of the plurality of conductive layers form a staircase shape, wherein
the first region of the staircase region includes a first sub-staircase portion ascending in a first direction toward the memory region, and a second sub-staircase portion disposed side by side with the first sub-staircase portion without interposing the plurality of conductive layers between the first and second sub-staircase portions, in a second direction opposite to the first direction from the first sub-staircase portion, the second sub-staircase portion ascending in the second direction, a shape of the end portions of the plurality of conductive layers located in the first direction in the first region being asymmetric to a shape of the end portions of the plurality of conductive layers located in the second direction in the first region, the end portions of the plurality of conductive layers in the first region forming a part of the staircase shape,
the second sub-staircase portion includes a lower staircase portion, an upper staircase portion, and an intermediate difference in level between the lower staircase portion and the upper staircase portion, the intermediate difference in level including a first number of layers, each stair of the lower staircase portion including a second number of layers, each stair of the upper staircase portion including a third number of layers, and the first number being larger than the second number and than the third number, and
the second number is equal to the third number.

13. The semiconductor storage device according to claim 12, wherein the lower staircase portion of the second sub-staircase portion is provided symmetrically to a part of the first sub-staircase portion in the second direction.

14. The semiconductor storage device according to claim 13, wherein
a number of conductive layers in the part of the first sub-staircase portion and a number of conductive layers in the lower staircase portion of the second sub-staircase portion are equal to each other, and
a number of conductive layers in a residual part of the first sub-staircase portion and a number of conductive layers in the upper staircase portion of the second sub-staircase portion are equal to each other.

15. The semiconductor storage device according to claim 14, wherein the residual part of the first sub-staircase portion is opposed to a lower portion of the intermediate difference in level of the second sub-staircase portion in the first direction.

16. The semiconductor storage device according to claim 12, wherein in the first sub-staircase portion, a contact connected to a conductive layer included in the first sub-staircase portion among the plurality of conductive layers is disposed.

17. The semiconductor storage device according to claim 16, wherein the conductive layer included in the first sub-staircase portion is coupled to a memory cell among the plurality of memory cells.

18. The semiconductor storage device according to claim 17, wherein a portion of a conductive layer included in the second sub-staircase portion among the plurality of conductive layers is not coupled to any memory cell among the plurality of memory cells.

19. The semiconductor storage device according to claim 1, wherein the intermediate difference in level extends between a bottom of the upper staircase portion and a top of the lower staircase portion.

20. The semiconductor storage device according to claim 1, wherein no terrace portion is disposed on any surfaces of the intermediate difference in level extending in the stacking direction.

\* \* \* \* \*